(12) United States Patent
Baloglu et al.

(10) Patent No.: US 9,269,872 B1
(45) Date of Patent: Feb. 23, 2016

(54) MOLDED ELECTRONIC PACKAGE GEOMETRY TO CONTROL WARPAGE AND DIE STRESS

(75) Inventors: Bora Baloglu, Chandler, AZ (US); Jeffrey R. Watson, Redmond, WA (US)

(73) Assignee: Amkor Technology, Inc., Tempe, AZ (US)

( * ) Notice: Subject to any disclaimer, the term of this patent is extended or adjusted under 35 U.S.C. 154(b) by 362 days.

(21) Appl. No.: 13/614,631

(22) Filed: Sep. 13, 2012

(51) Int. Cl.
*H01L 33/52* (2010.01)

(52) U.S. Cl.
CPC ..................... *H01L 33/52* (2013.01)

(58) Field of Classification Search
CPC ............... H01L 2924/00; H01L 2224/32225; H01L 2224/73265
USPC ........................... 257/787, E21.502; 438/127
See application file for complete search history.

(56) References Cited

U.S. PATENT DOCUMENTS

| 2002/0079575 A1* | 6/2002 | Hozoji ............. H01L 23/49816 257/734 |
| 2007/0138656 A1* | 6/2007 | Khaw et al. .................... 257/787 |
| 2010/0093135 A1* | 4/2010 | Lii et al. ........................ 438/127 |

* cited by examiner

*Primary Examiner* — Fernando L Toledo
*Assistant Examiner* — Lawrence-Linh T Nguyen
(74) *Attorney, Agent, or Firm* — McAndrews, Held & Malloy

(57) ABSTRACT

A method and system are provided for a molded electronic package geometry that enables control of warpage and die stress. A mold tool can be closed to define a space or cavity about a semiconductor die disposed on a substrate. Once the mold tool is closed, a mold material can be applied to the space to produce a mold cap. The mold cap geometry can have a first surface that is in contact with the surface of the substrate and a second surface that is opposite the first surface. The second surface can define a tapered portion of the mold cap in which the larger thickness of the tapered portion of the mold cap is in proximity to the semiconductor die and the smaller thickness of the tapered portion of the mold cap is away from the semiconductor die. The thickness of the tapered portion can vary linearly or non-linearly.

18 Claims, 15 Drawing Sheets

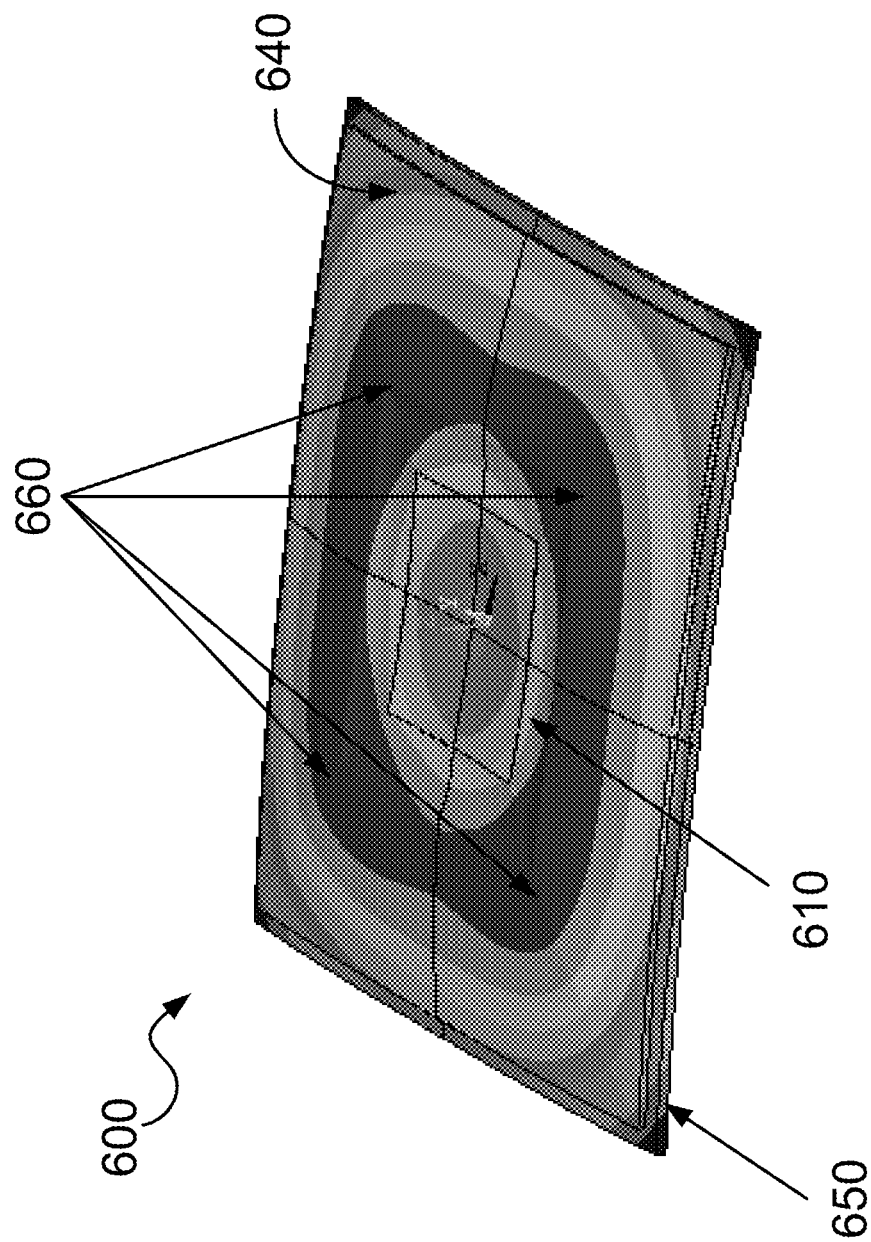

MOLDED ELECTRONIC PACKAGE GEOMETRY TO CONTROL WARPAGE AND DIE STRESS

FIELD OF TECHNOLOGY

Certain embodiments of the disclosure relate to packaging of electronic devices. More specifically, certain embodiments of the disclosure relate to a molded electronic package geometry to control warpage and die stress.

BACKGROUND

Electronic packages can be molded in a plastic compound to improve the interconnect reliability between a semiconductor die and a substrate and to help keep the substrate flat for assembly onto a circuit board. The molding compound and the substrate can have different coefficients of thermal expansion, glass transition temperatures, shrink rates, and/or mechanical rigidity, which can cause warping and/or stresses on the semiconductor die and/or on the substrate when there are room temperature changes or during temperature cycling.

Further limitations and disadvantages of conventional and traditional approaches will become apparent to one of skill in the art, through comparison of such systems with some aspects of the present disclosure as set forth in the remainder of the present application with reference to the drawings.

BRIEF DESCRIPTION OF SEVERAL VIEWS OF THE DRAWINGS

FIG. 6B is a perspective view of the example of FIG. 6A showing the displacement contour for a heating up process.

DETAILED DESCRIPTION

Figure 1A:
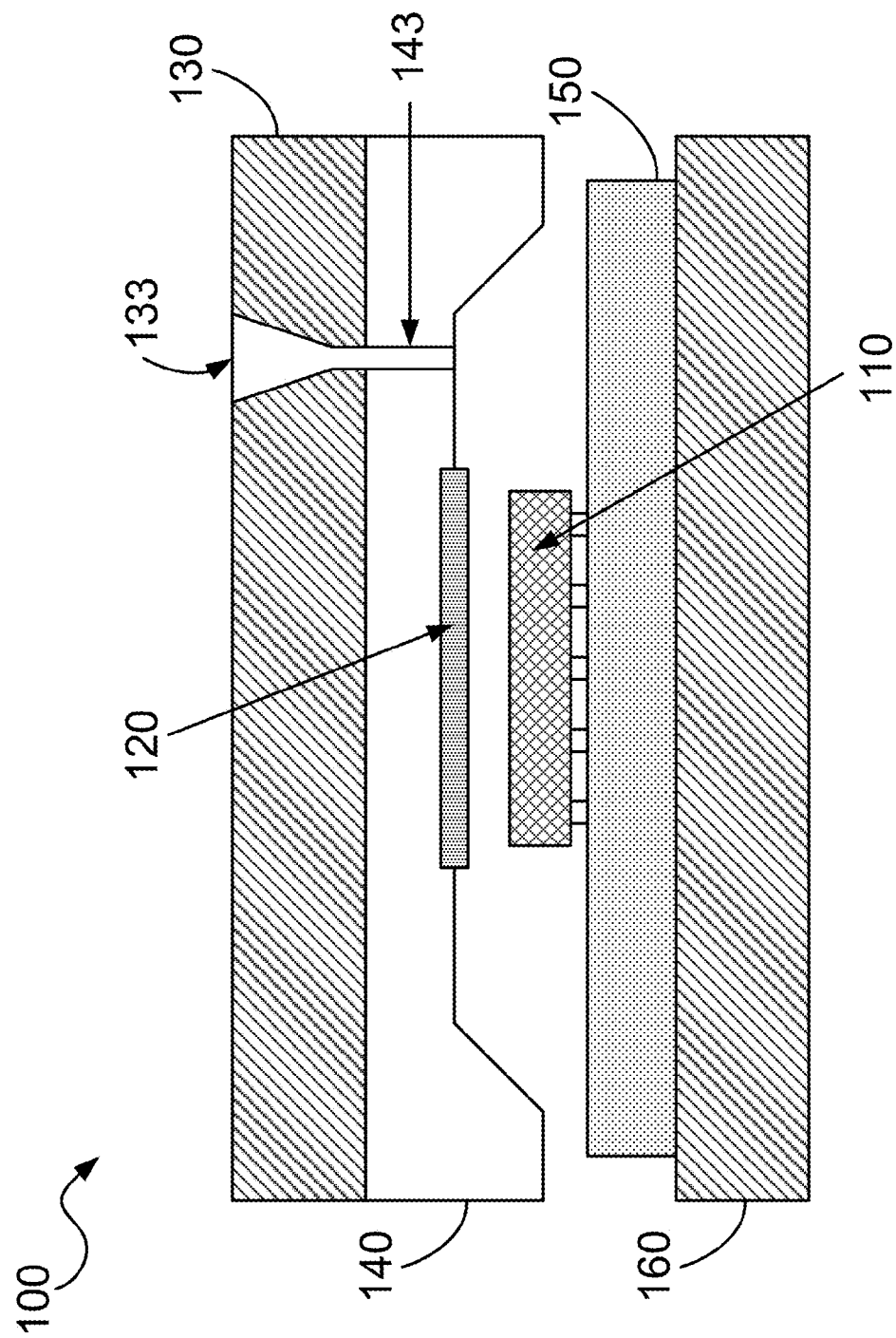
FIGS. 1A-1C are each a schematic view of an example of a mold tool to produce a mold cap in an electronic package.

Certain implementations described in the disclosure relate to a method and system for a molded electronic package geometry to control warpage and die stress. Aspects of the implementations disclosed include producing an electronic package having a substrate, a semiconductor die on the substrate, and a mold cap about the semiconductor die. The geometry of the mold cap can be optimized to address warping and/or stress effects on the semiconductor die that can be caused by differences in material properties between the mold compound, the semiconductor die, and/or the substrate. In some instances, the thickness difference between the mold cap and the substrate can also contribute to warping. Instead of using a typical or standard mold cap with a constant thickness, the optimized mold cap can have a thickness that varies in a direction moving away from the semiconductor die. The three-dimensional (3D) shape of the mold cap can be such that the thickness of the mold cap near or in the proximity of the semiconductor die can be larger than the thickness of the mold cap away from the semiconductor die. The tapered portion of the mold cap can have a monotonically varying thickness, where the variation can be linear or non-linear, for example.

A semiconductor die can be covered or encapsulated in mold material, which may also be referred to herein as a mold compound or molding material. Examples of reasons for using a mold compound include, but need not be limited to, the protection of die connections, the protection of the die from general mechanical forces, to provide a base for electrical connection fanout, to provide a base for mounting a heat sink, and to control warpage of the semiconductor die and/or of the overall integrated circuit package. A difference in the coefficient of thermal expansion (CTE) of the semiconductor die and the mold material can create stresses in the semiconductor die at the side faces. In some instances, these stresses can lead to cracking of the semiconductor die, reducing yields and raising production costs.

Using an "undercut" or "UC" can control and/or reduce the stresses that appear at the "die-to-mold" surface. An undercut can be produced when, during covering or encapsulation of the semiconductor die, a flat die seal is used that is larger than the surface of the semiconductor die surface onto which the die seal is compressed. A die seal can be used to ensure a mold free top surface of the semiconductor die. When a flat die seal is pressed against the top surface of the semiconductor die, any portion of the die seal that extends beyond the edges of the top surface of the semiconductor die tends to bulge in the direction of the force placed upon the die seal, creating a semi-circular convex shape. As the mold material flows into the tool used to cover or encapsulate the semiconductor die, the convex shape of the bulging die seal extension, which partially defines the shape of the space or cavity formed by the mold tool, causes the mold material to take on a concave semi-circular shape along the sides of the semiconductor die.

The implementations disclosed herein improve reliability in what are referred to as Flip-Chip molded Ball Grid Array (FCmBGA) packages, for example. Other types of electronic packages, however, can make use of various aspects of the implementations described in this disclosure. Moreover, warpage or warping can refer to variations of a surface of a substrate or of a surface of a semiconductor die from a reference plane and/or from a center point. In some instances, warpage or warping can also be referred to as bowing.

Figure 1B:
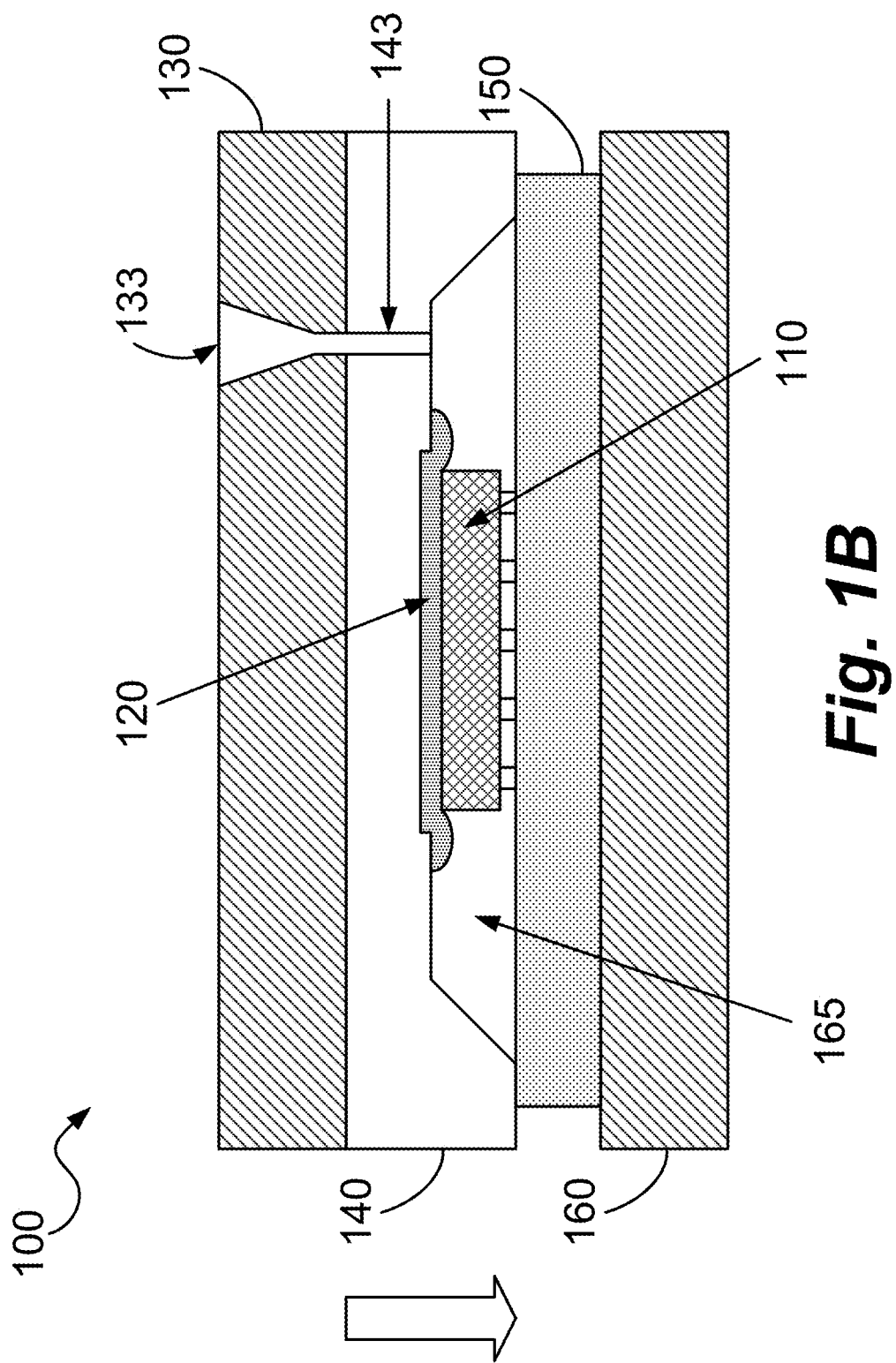
Figure 1C:
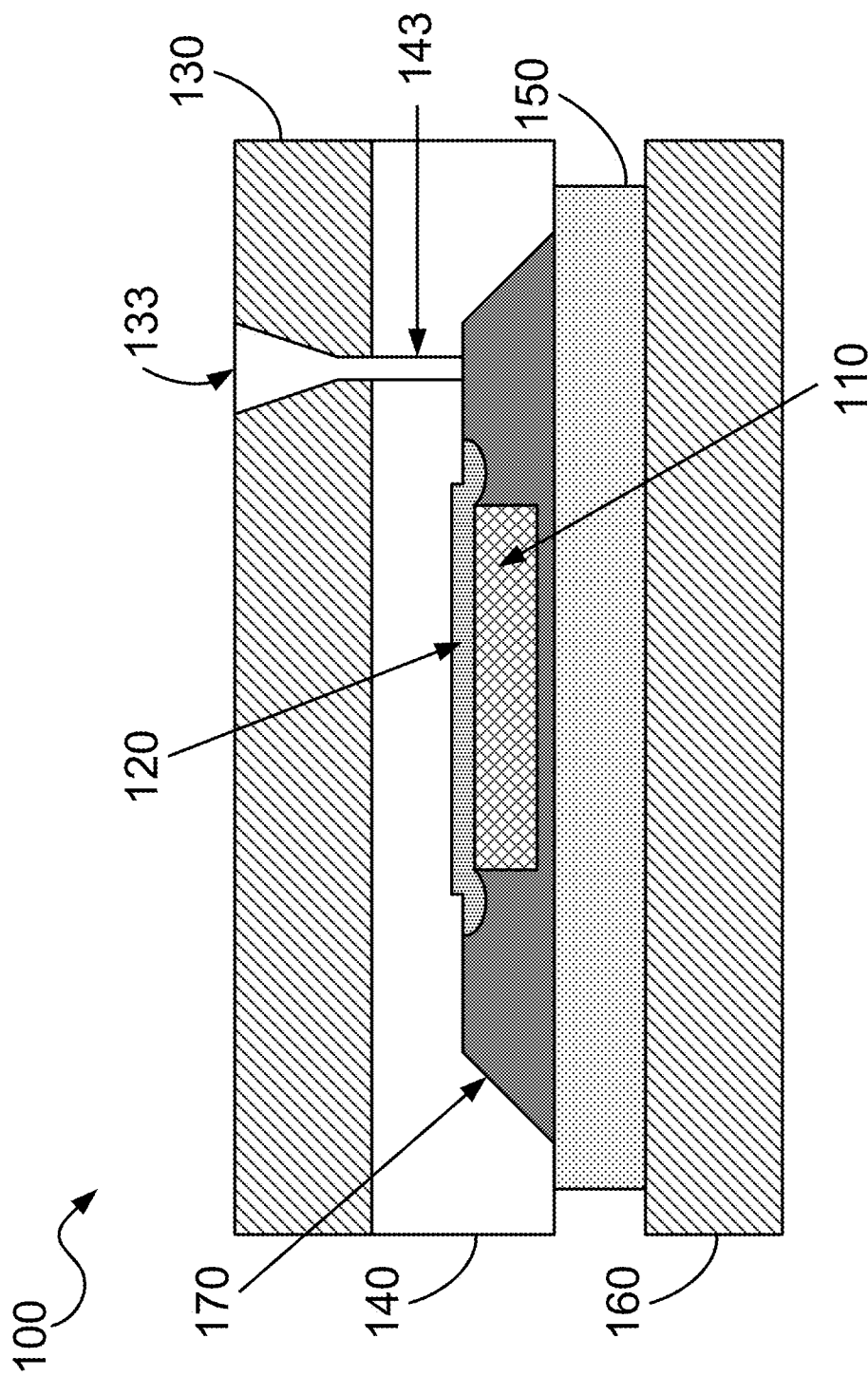

FIGS. 1A-1C are each a schematic view of an example of a mold tool to produce a mold cap in an electronic package. As illustrated in FIG. 1A, a mold tool 100 can include an upper chase 130, a middle plate 140 (also referred to herein as the middle layer 140 and/or the middle chase 140) to which a die seal 120 can be mounted, and a lower chase 160. The die seal 120 can be a flexible die seal. Typically, the die seal 120 can be partially embedded into the middle plate 140. In some instances, however, the die seal 120 can be fully embedded into the middle plate 140. Moreover, the die seal 120 can be a silicon rubber material such as Softec™ available from ASM (http://www.asm.com/). The semiconductor die 110 is shown mounted to a substrate 150, which is resting on the lower chase 160. The substrate 150 can be a thin or coreless substrate, for example.

During the operation of packaging, as shown in FIG. 1B, downward pressure on the upper chase 130 causes the middle plate 140 to bear down upon the substrate 150, clamping the substrate against the lower chase 160 and closing the mold tool 100. The downward movement causes the die seal 120 to press down upon the semiconductor die 110, protecting the upper surface of the semiconductor die 110 from the mold material used to cover parts of the semiconductor die 110, which enters a cavity or space 165 of the mold tool 100 via molding gate elements 133/143 in the upper chase 130 and the middle layer 140, respectively. The cavity or space 165 is defined by the geometry of the middle plate 140, the semiconductor die 110, and the substrate 150. The pressure of the middle plate 140 upon the flexible material of the die seal 120 can deform those portions of the die seal 120 that extend beyond the upper surface of the semiconductor die 110, forming a downward bulge at each edge of the semiconductor die 110.

As illustrated by FIG. 1C, a mold material 170 used to form a mold cap can be shaped by the boundaries formed by the side faces of the semiconductor die 110, the die seal 120, the middle plate 140, and the substrate 150. After an appropriate amount of time, pressure upon the upper chase 130 is removed, the upper chase 130 and middle chase 140 are moved away from the substrate 150 and the lower chase 160, and the substrate 150 with the semiconductor die 110 covered in mold material 170 (i.e., mold cap) is then removed from the mold tool 100. The process may then be repeated.

It should be noted that although FIGS. 1A-1C show a single mold tool 100, the elements of the mold tool 100 described above may be part of a larger apparatus having multiple cavities each with respective upper chase, middle layer, and lower chase elements, for applying mold material to multiple die/substrate assemblies in a single operation, without departing from the spirit or scope of the present disclosure. In another example, the elements of the mold tool 100 can be part of a larger apparatus having a single cavity into which multiple die are molded as a single system-in-package, for example each die having a respective die seal disposed in the mold tool 100. In yet another example, the elements of the mold tool 100 can be part of a larger apparatus having a single cavity into which multiple independent die are molded in a mass-molding (or gang-molding) fashion and later separated into single packages. In such multi-die configurations, the molding can be performed using a single continuous seal having a set of seal features as discussed herein (e.g., a single set of seal features for the multiple die and/or a respect set of seal features for each of the multiple die), or can be performed using multiple seals, one for each respective die, and each having a respective set of seal features as discussed herein.

Figure 2A:
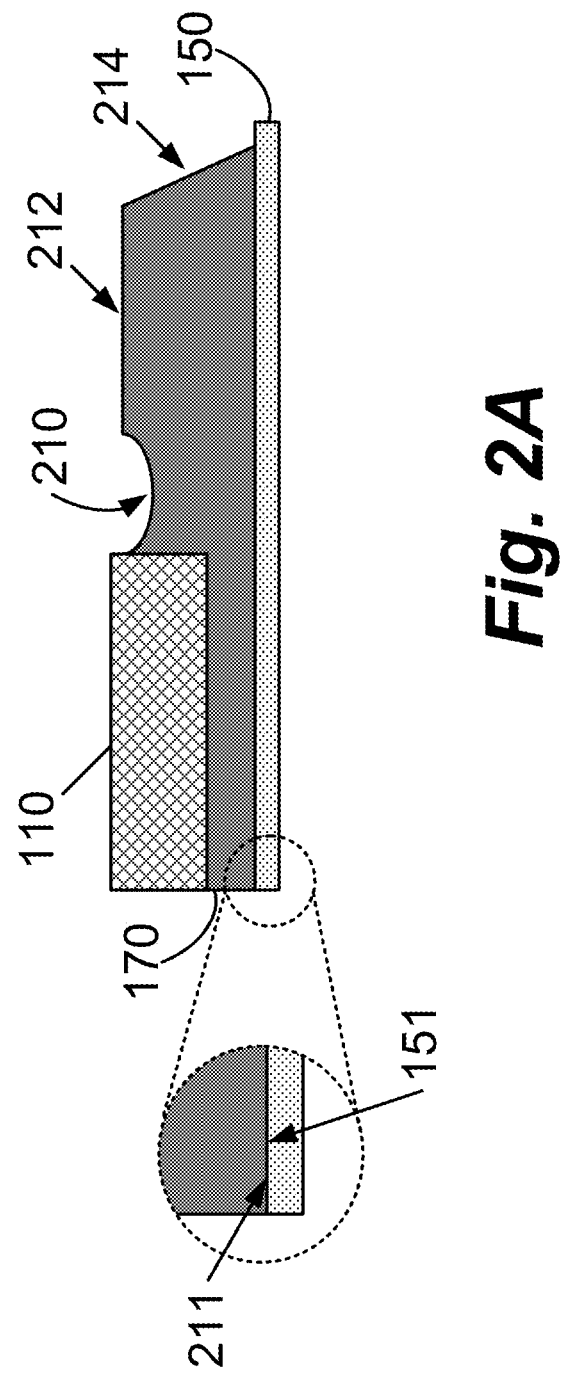
FIG. 2A is an enlarged partial cross sectional view of an example of a mold cap with constant thickness.

FIG. 2A is an enlarged partial cross sectional view of an example of a mold cap with constant thickness. Referring to FIG. 2A, there is shown a mold cap made of the mold material 170 described above. The shape or geometry of the mold cap can be such that one of its surfaces is in contact with a surface of the substrate 150. For example, as shown in the inset, a surface 211 of the mold cap can be in contact with a surface 151 of the substrate 150. Opposite the surface 211 of the mold cap, there can be an undercut 210 produced by the bulging of the die seal 120 during the packaging operation. One portion of the undercut 210 can be next to or adjacent to the semiconductor die 110 while another portion of the undercut 210 can be next to or adjacent to a surface 212 of the mold cap, which in turn is substantially parallel to the surface 211 of the mold cap that is in contact with the substrate 150. The surface 212 of the mold cap can extend from the undercut 210 until close to the edge of the substrate 150 where a surface 214 of the mold cap terminates the edge portion of the mold cap.

Because the region or portion of the mold cap between the undercut 210 and the edge of the substrate 150 has a thickness that is substantially constant, this implementation is generally referred to as a constant thickness mold cap. The constant thickness mold cap, however, may not provide the ability to optimize the shape or geometry of the electronic package to control or reduce warpage and/or stress.

Figure 2B:
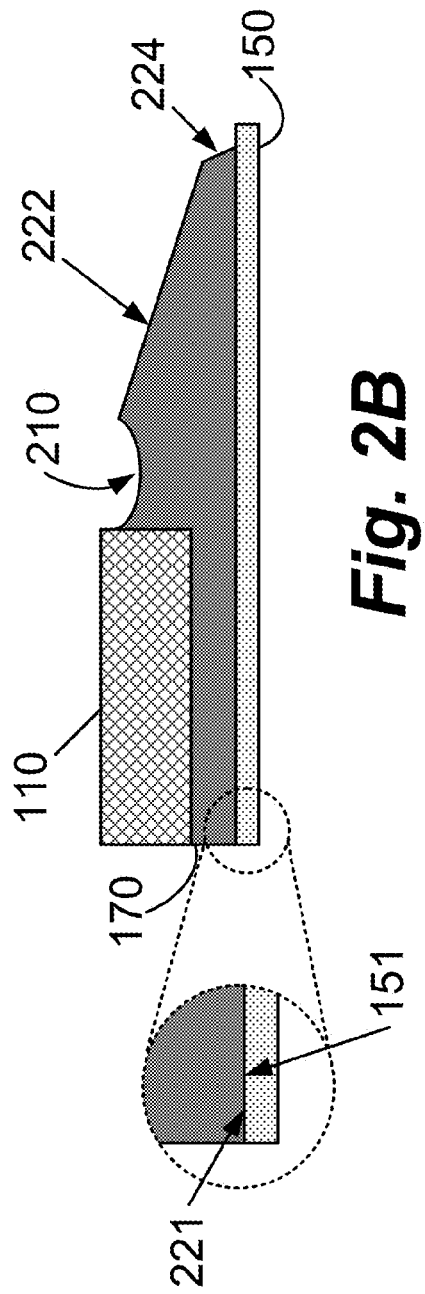
FIGS. 2B and 2C are each an enlarged partial cross sectional view of an example of a mold cap with tapered thickness.
Figure 2C:
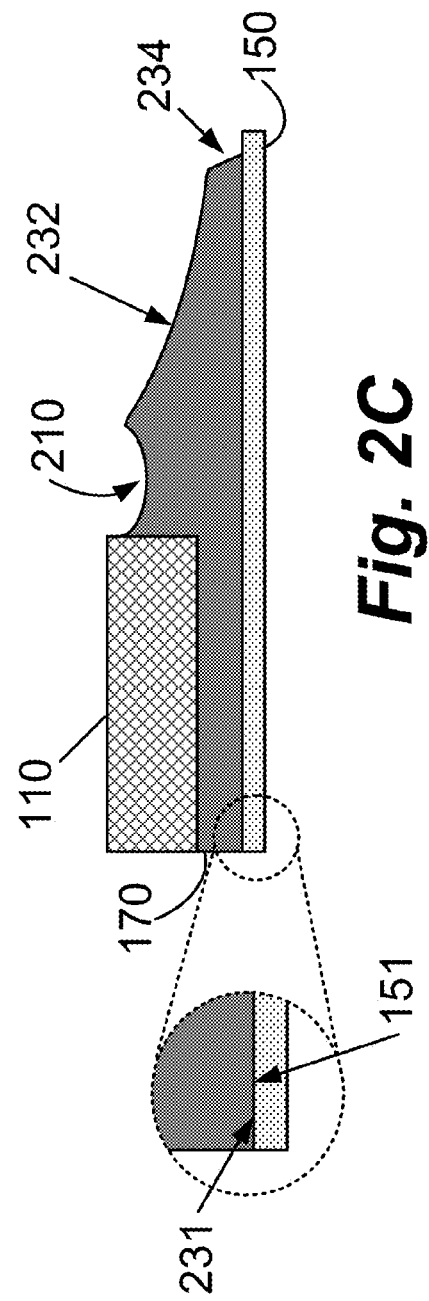

FIGS. 2B and 2C are each an enlarged partial cross sectional view of an example of a mold cap with tapered thickness. Referring to FIG. 2B, there is shown a different mold cap geometry in which one portion of the undercut 210 is next to or adjacent to the semiconductor die 110 while another portion of the undercut 210 is next to or adjacent to a surface 222 of the mold cap. The surface 222 of the mold cap is not substantially parallel to a surface 221 of the mold cap that is in contact with the surface 151 of the substrate 150 as is the case with the constant thickness mold cap. Instead, the surface 222 of the mold cap defines a tapered region of the mold cap in which the largest thickness is next to or adjacent to the undercut 210 and the smallest thickness is next to or adjacent to the edge of the substrate 150 where a surface 224 of the mold cap that terminates the edge portion of the mold cap. The tapered portion of the mold cap shown in FIG. 2B can have a monotonic behavior. More particularly, the thickness of the tapered portion of the mold cap can vary linearly in a direction moving away from the semiconductor die 110 and towards the end of the substrate 150.

Referring to FIG. 2C, there is shown yet another mold cap geometry in which one portion of the undercut 210 is next to or adjacent to the semiconductor die 110 while another portion of the undercut 210 is next to or adjacent to a surface 232 of the mold cap. Like the surface 222 described above, the surface 232 of the mold cap is not substantially parallel to a surface 231 of the mold cap that is in contact with the surface 151 of the substrate 150. Instead, the surface 232 of the mold cap defines a tapered region of the mold cap in which the largest thickness is next to or adjacent to the undercut 210 and the smallest thickness is next to or adjacent to the edge of the substrate 150 where a surface 224 of the mold cap that terminates the edge portion of the mold cap. The tapered portion of the mold cap shown in FIG. 2C can have a monotonic behavior. More particularly, the thickness of the tapered portion of the mold cap can vary non-linearly in a direction moving away from the semiconductor die 110 and towards the end of the substrate 150.

The examples presented above with respect to FIGS. 2B and 2C are provided by way of illustration and not of limitation. Other shapes or geometry for a mold cap in which the thickness of the mold cap is decreased towards the side of the package can be used to control or reduce the warpage and/or the stresses that can occur in an electronic package. One way to implement this approach can be by changing the geometry of the middle plate 140 such that the mold material 170 introduced into the cavity or space 165 during packaging produces a mold cap with the desired thickness profile. In such a case, the rest of the mold tool 100 can remain substantially the same.

Figure 3A:
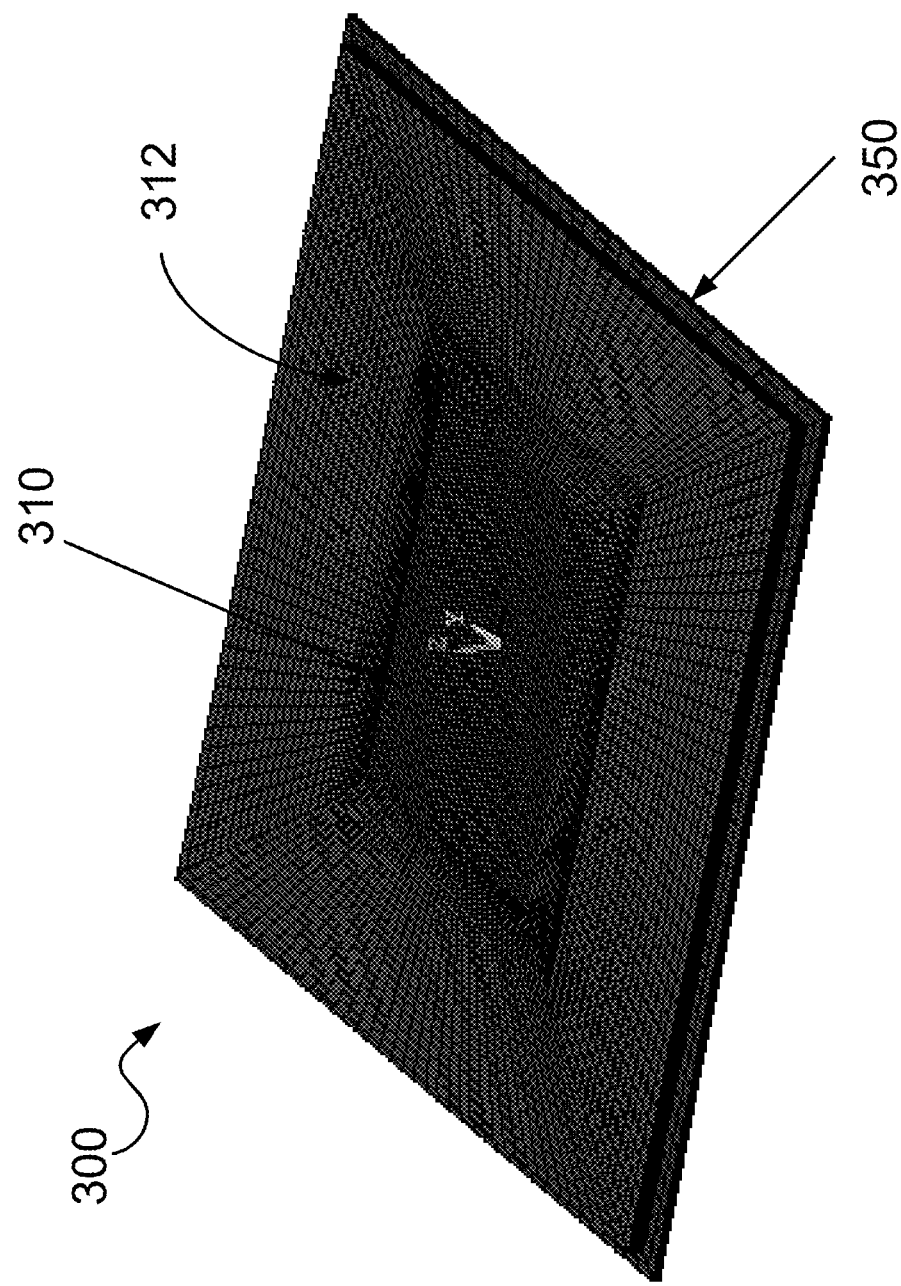
FIG. 3A is a perspective view of an example finite element model of a mold cap with a constant thickness.

FIG. 3A is a perspective view of an example finite element model of a mold cap with a constant thickness. Referring to FIG. 3A, there is shown a simulation of a finite element model 300 that represents a mold cap with a constant thickness produced using a mold tool similar to the one described above with respect to FIGS. 1A-1C. The finite element model 300 shows a semiconductor die 310 mounted or disposed at the center of a substrate 350. Also shown is a surface 312 of the mold cap corresponding to a region of the mold cap that has a constant thickness.

Figure 3B:
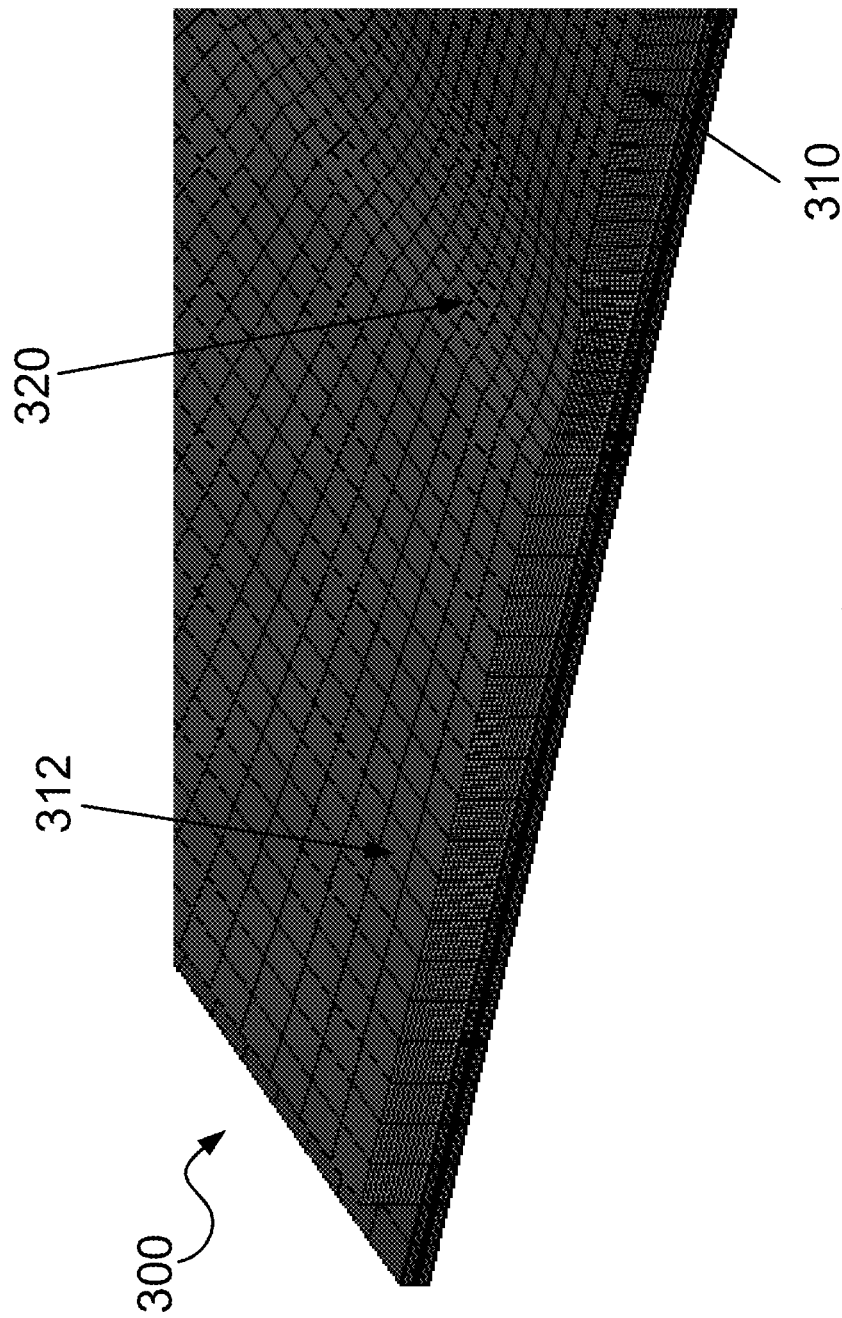
FIG. 3B is an enlarged partial cross sectional view of the finite element model of a mold cap with a constant thickness.

FIG. 3B is an enlarged partial cross sectional view of the finite element model 300 of a mold cap with a constant thickness. Referring to FIG. 3B, the surface 312 with the constant thickness is shown more clearly and it stretches from one end of an undercut 320 to the side or end of the substrate 350. The opposite end of the undercut 320 is shown as being next to or adjacent to the semiconductor die 310. The finite element model 300 can correspond to the mold cap shape described with respect to FIG. 2A, for example.

Figure 4A:
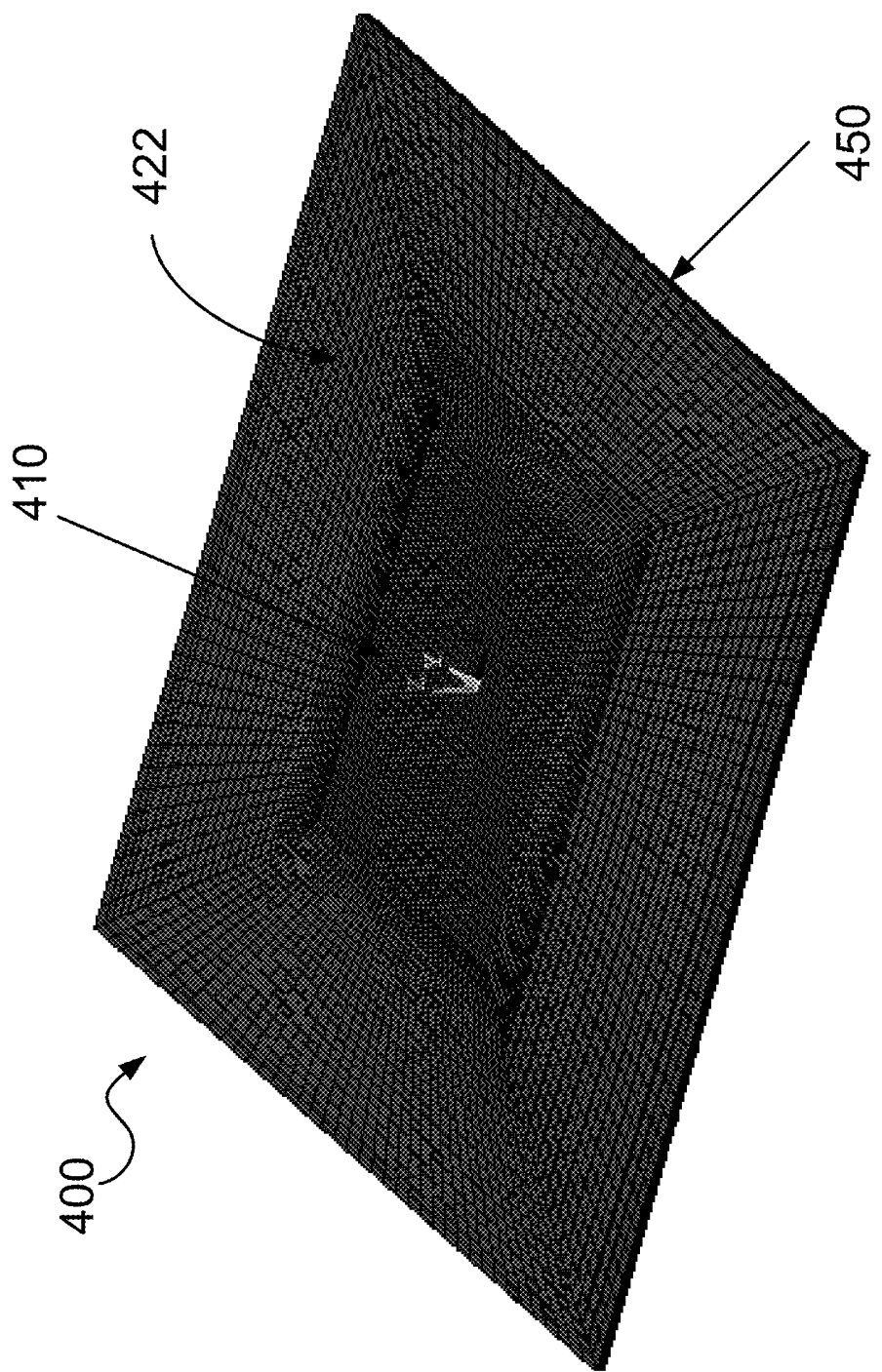
FIG. 4A is a perspective view of an example finite element model of a mold cap with a tapered thickness.

FIG. 4A is a perspective view of an example finite element model of a mold cap with a tapered thickness. Referring to FIG. 4A, there is shown a simulation of a finite element model 400 that represents a mold cap with a tapered thickness produced using a mold tool similar to the one described above with respect to FIGS. 1A-1C with a middle plate having the appropriate shape or geometry. The finite element model 400 shows a semiconductor die 410 mounted or disposed at the center of a substrate 450. Also shown is a surface 422 of the mold cap corresponding to a region of the mold cap that has a tapered thickness.

Figure 4B:
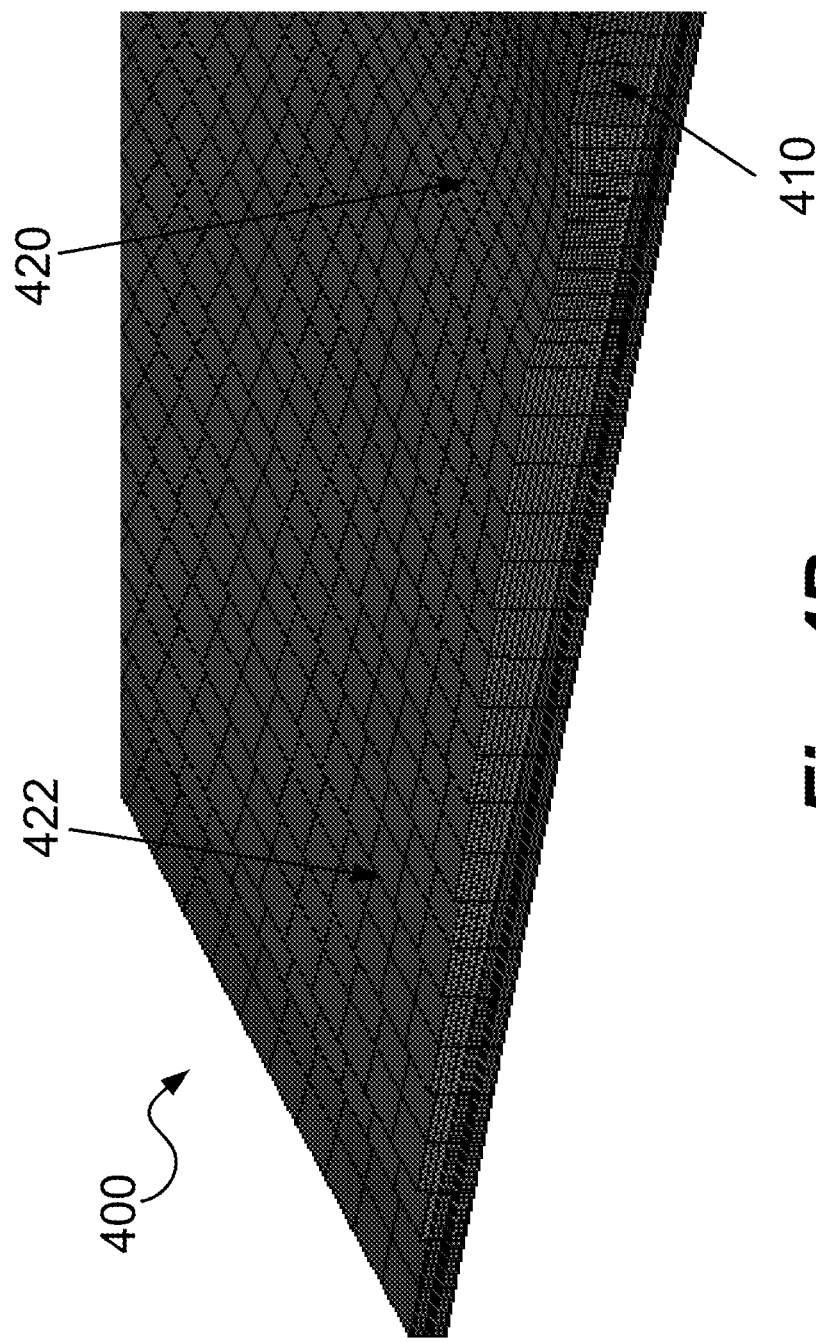
FIG. 4B is an enlarged partial cross sectional view of the finite element model of a mold cap with a tapered thickness.

FIG. 4B is an enlarged partial cross sectional view of the finite element model 400 of a mold cap with a tapered thickness. Referring to FIG. 4B, the surface 422 with the tapered thickness is shown more clearly and it stretches from one end of an undercut 420 to the side or end of the substrate 450. The opposite end of the undercut 420 is shown as being next to or adjacent to the semiconductor die 410. The thickness of the mold cap decreases towards the side or edge of the substrate 450. That is, the thickness is larger near the undercut 420 and gets smaller away from the undercut 420. The finite element model 400 can correspond to the mold cap shape described with respect to FIG. 2B, for example.

The finite element model 400 of a mold cap can not only have its tapered design optimized but may also have mechanical rigidity, CTE effect, and/or shrink pull forces optimized to offset package warpage that can be introduced by, for example, the CTE mismatch between the semiconductor die and the substrate.

Figure 5B:
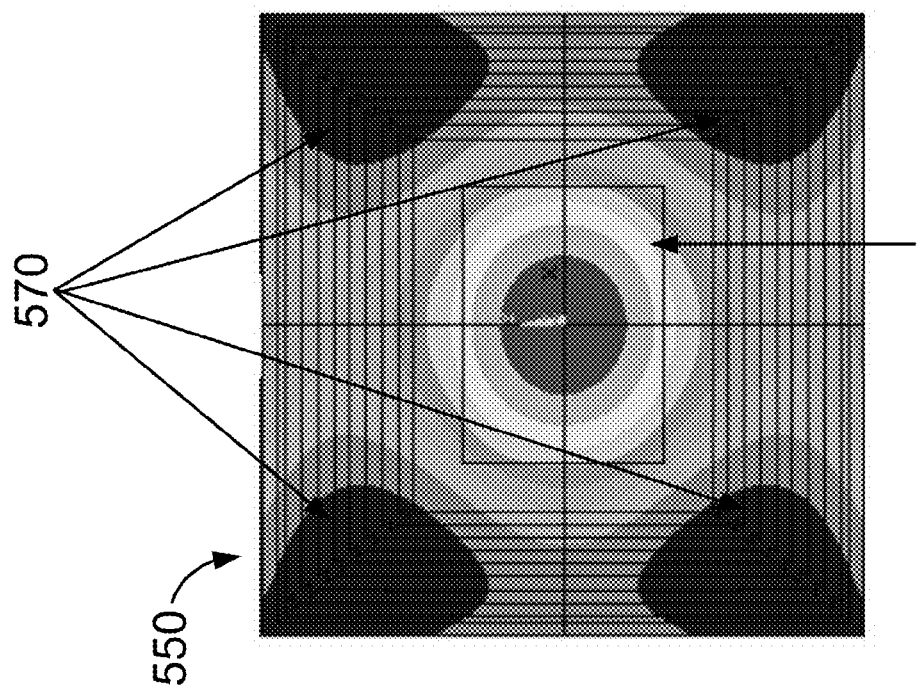
FIG. 5B is a top view of an example of simulated warping in a mold cap with a tapered thickness.
Figure 5A:
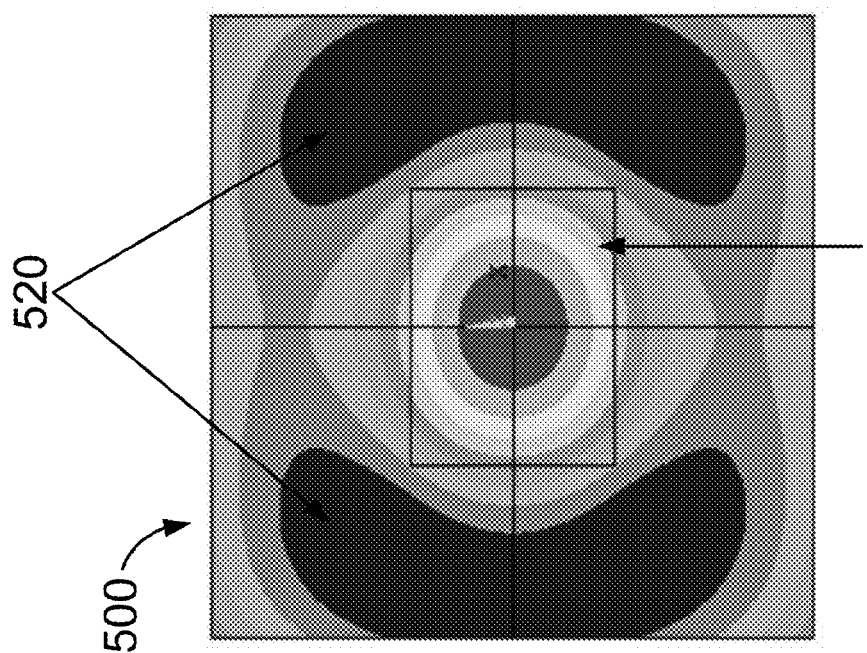
FIG. 5A is a top view of an example of simulated warping in a mold cap with a constant thickness.

FIG. 5A is a top view of an example of simulated warping in a mold cap with a constant thickness. Referring to FIG. 5A, there are shown simulation results that illustrate warping in an electronic package 500 with a semiconductor die 510. The electronic package 500 can have a mold cap with a constant thickness. The regions 520 show the downward out-of-plane movement that results from the mold compound.

FIG. 5B is a top view of an example of simulated warping in a mold cap with a tapered thickness. Referring to FIG. 5B, there are shown simulation results that illustrate warping in an electronic package 550 with a semiconductor die 560. The dimensions of the electronic package 550 and of the semiconductor die 560 can be substantially similar to those of the electronic package 500 and the semiconductor die 510, respectively. In the electronic package 550, the tapered mold cap geometry can adjust the contribution of the mold compound towards the warping between the substrate and the mold compound. For example, the tapered mold cap geometry changes the weighting by changing the thickness of the mold compound, which results in less warpage because the mold compound's push down effect on the substrate is lessened as illustrated by the regions 570. In the results shown in FIGS. 5A and 5B, the warpage produced with the tapered mold cap can be about 25 percent less than that produced with the constant thickness mold cap.

Figure 6A:
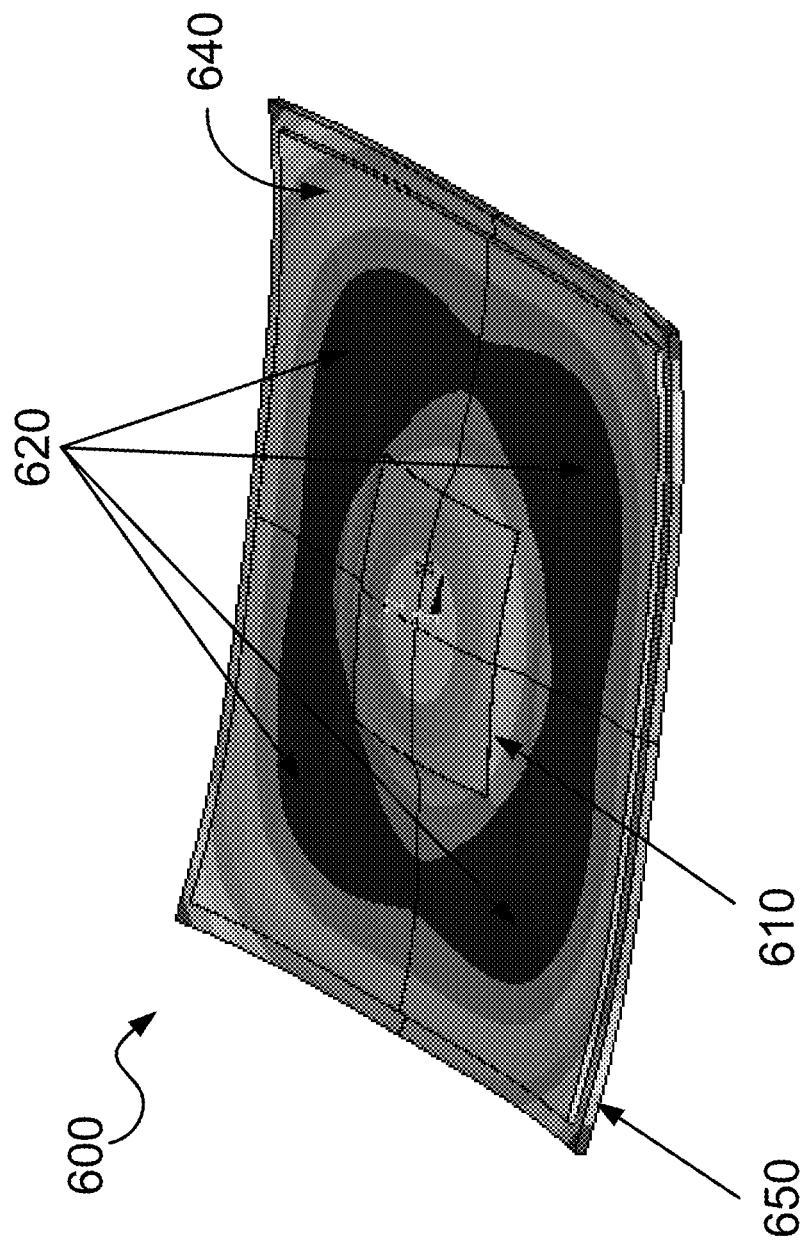
FIG. 6A is a perspective view of another example of simulated warping in a mold cap with tapered thickness that shows the displacement contour for a cool down process.

FIG. 6A is a perspective view of another example of simulated warping in a mold cap with tapered thickness that shows the displacement contour for a cool down process from cure temperature of about 165 degrees Celsius (° C.) to room temperature of about 25° C. Referring to FIG. 6A, there are shown simulation results that illustrate warping in an electronic package 600 with a semiconductor die 610, a substrate 650, and a mold cap 640. The mold cap 640 can have a tapered thickness and can be made using a first type of build up material (e.g., MUF-21). The size of the semiconductor die 610 can be 9.5 millimeters (mm) by 9.8 mm, for example. The substrate 650 can be a coreless substrate and can be made of a material such as GZ-41, for example.

The regions 620 indicate portions of the electronic package 600 where downward warping or bowing occurs. The regions 620 surround portions of the semiconductor die 610 but are not sufficiently close to the semiconductor die 610 to produce strong warpage and/or stresses in the die. The corners of the electronic package 600 are shown to bend or bow slightly upwards in the simulation results shown in FIG. 6A as a result of the cool down to room temperature.

FIG. 6B is a perspective view of the example in FIG. 6A showing the displacement contour for a heating up process to about 260° C. Referring to FIG. 6B, there are shown simulation results that illustrate warping in the electronic package 600. In this example, the regions 660 indicate portions of the electronic package 600 where upward warping or bowing occurs. The regions 660, like the regions 620 in FIG. 6A, surround portions of the semiconductor die 610 but are not sufficiently close to the semiconductor die 610 to produce strong warpage and/or stresses in the die. The corners of the electronic package 600 are shown to bend or bow slightly downwards in the simulation results shown in FIG. 6B as a result of heating up the electronic package to about 260° C.

Figure 7A:
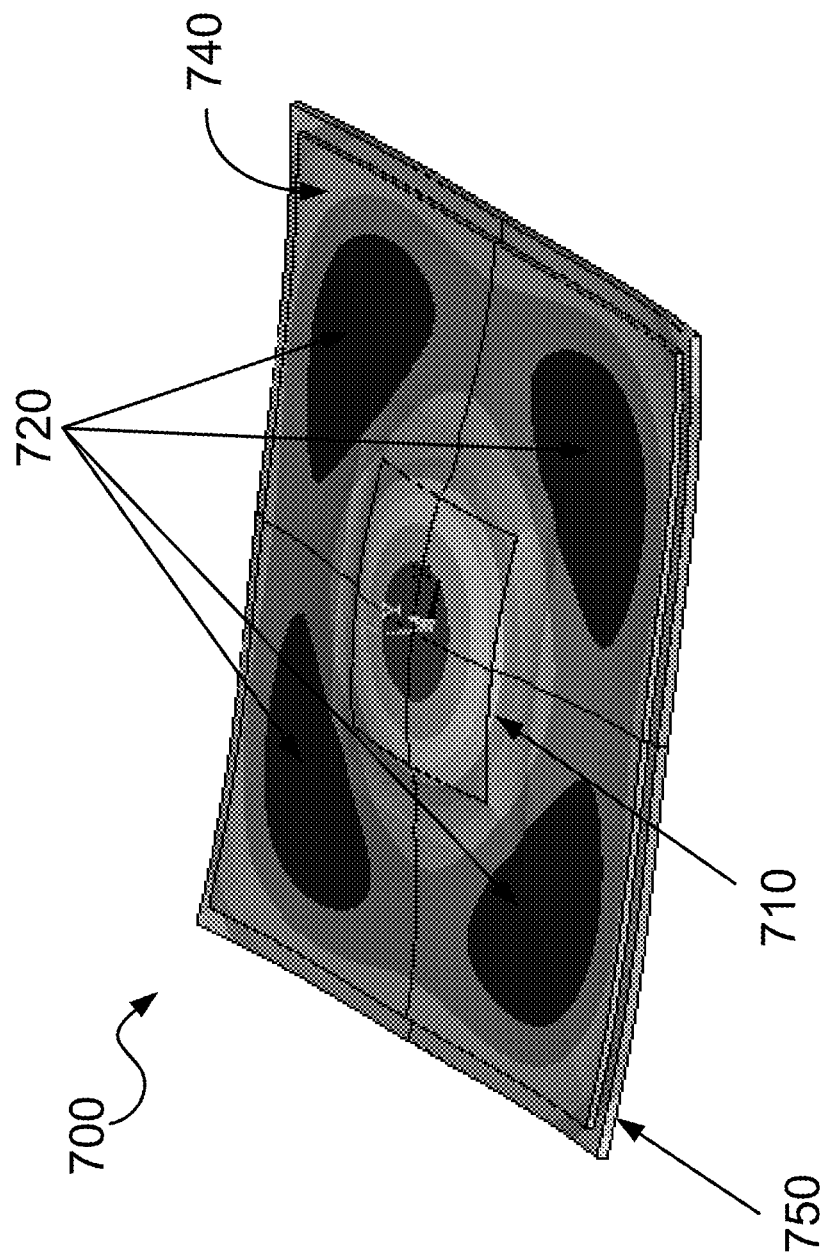
FIG. 7A is a perspective view of another example of simulated warping in a mold cap with tapered thickness that shows the displacement contour for a cool down process.

FIG. 7A is a perspective view of another example of simulated warping in a mold cap with tapered thickness that shows the displacement contour for a cool down process from cure temperature of about 165° C. to room temperature of about 25° C. Referring to FIG. 7A, there are shown simulation results that illustrate warping in an electronic package 700 with a semiconductor die 710, a substrate 750, and a mold cap 740. The mold cap 740 can have a tapered thickness and can be made using a type of build up material similar to the one used to make the mold cap 640 in FIGS. 6A and 6B (e.g., MUF-21). The size of the semiconductor die 710 can be 9.5 mm by 9.8 mm, for example. The substrate 750 can be a coreless substrate and can be made of a material such as GX13-T31, for example.

The regions 720 indicate portions of the electronic package 700 where downward warping or bowing occurs. The regions 720 surround portions of the semiconductor die 710 but are not sufficiently close to the semiconductor die 710 to produce strong warpage and/or stresses in the die. The regions 720 are farther away from the semiconductor die 710 than the regions 620 are from the semiconductor die 610 in FIG. 6A. The corners of the electronic package 700 are shown to barely bend or bow upwards in the simulation results shown in FIG. 7A as a result of the cool down to room temperature.

Figure 7B:
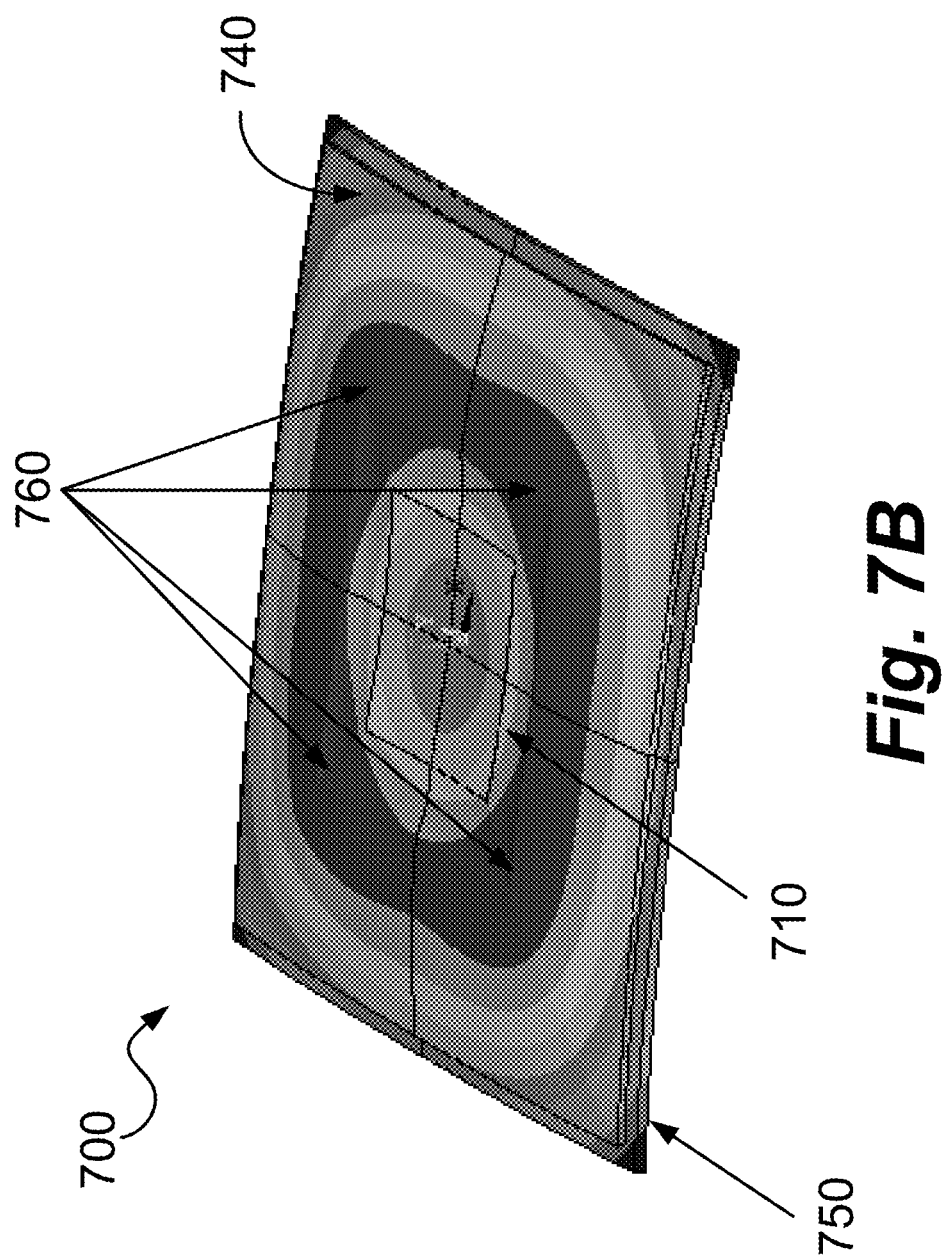
FIG. 7B is a perspective view of the example in FIG. 7A showing the displacement contour for a heating up process.

FIG. 7B is a perspective view of the example in FIG. 7A showing the displacement contour for a heating up process to about 260° C. Referring to FIG. 7B, there are shown simulation results that illustrate warping in the electronic package 700. In this example, the regions 760 indicate portions of the electronic package 700 where upward warping or bowing occurs. The regions 760 surround portions of the semiconductor die 710 but are not sufficiently close to the semiconductor die 710 to produce strong warpage and/or stresses in the die. The corners of the electronic package 700 are shown to bend or bow slightly downwards in the simulation results shown in FIG. 7B as a result of heating up the electronic package to about 260° C.

Figure 8:
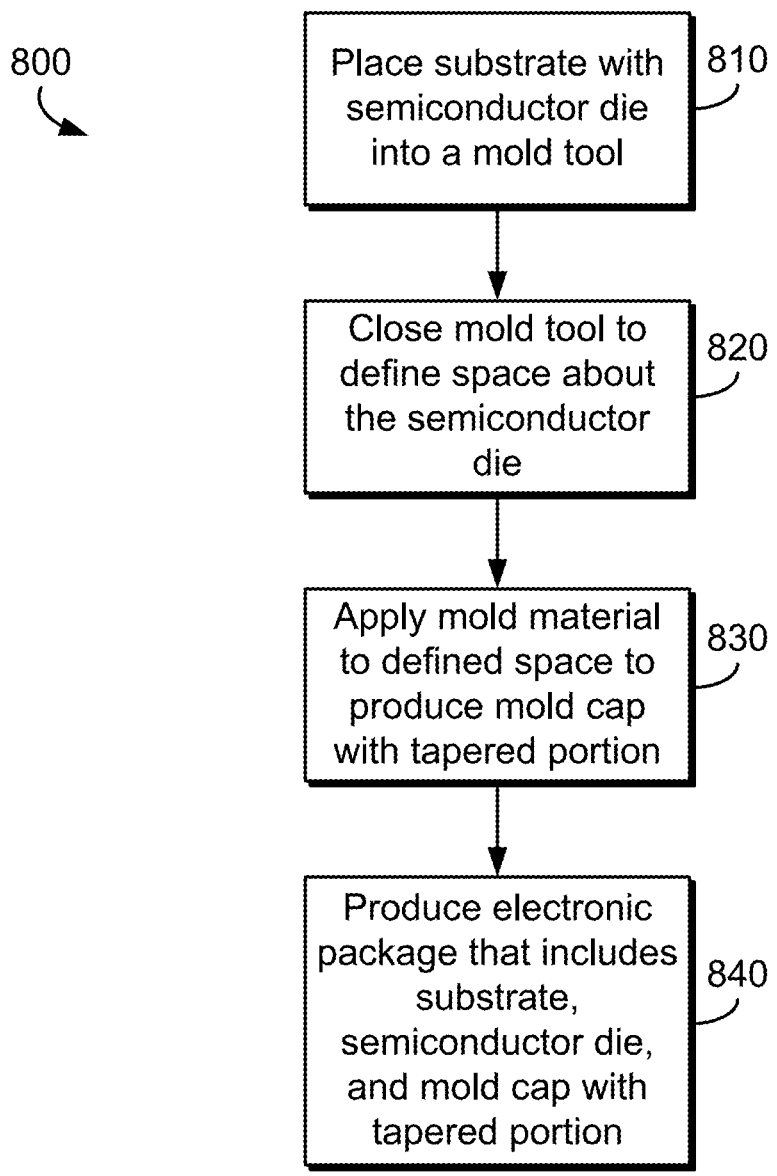
FIG. 8 is flow chart that illustrates examples of steps for producing a mold cap with a tapered region for an electronic package.

FIG. 8 is flow chart that illustrates examples of steps for producing a mold cap with a tapered region for an electronic package. Referring to FIG. 8, there is shown a flow chart 800 in which, at step 810, a substrate with a semiconductor die can be placed in a mold tool. At step 820, the mold tool can be closed to define a space or cavity about the semiconductor die where a mold material or mold compound (e.g., epoxy molding compound) can be introduced. As discussed previously, the geometry of the mold tool (e.g., the middle plate, plate inserts, seals, etc.) may be tapered to cause a corresponding taper to be formed on a molded cap.

At step 830, the molding material can be applied to the defined space to produce a mold cap with a tapered portion such as the mold cap examples illustrated in FIGS. 2B and 2C. The mold cap can have a first surface (e.g., the surfaces 221 and 231) that is in contact with a surface (e.g., the surface 151) of the substrate. The mold cap can also have a second surface that is opposite the first surface (e.g., the surfaces 222 and 232). At step 840, an electronic package can be produced that includes the substrate, the semiconductor die, and the mold cap with the tapered portion.

In connection with the steps described above for the flow chart 800, a flexible die seal can be applied to a surface of the semiconductor die. The flexible die seal can produce an undercut on the second surface of the mold cap adjacent to the semiconductor die. The tapered portion of the mold cap can have the larger thickness adjacent to the undercut and the smaller thickness away from the undercut. For example, the smaller thickness can be closer to the end or the side of the substrate.

The tapered portion of the mold cap produced in connection with the steps described above for the flow chart 800 can have a thickness that varies monotonically. In some instances, the thickness of the tapered portion of the mold cap can vary linearly. In other instances, the thickness of the tapered portion of the mold cap can vary non-linearly.

In another implementation, an electrical circuit can be produced by placing a semiconductor die in a mold tool, closing the mold tool to define a space about the semiconductor die, and applying a mold material to at least a portion of the defined space to produce a mold cap in contact with the semiconductor die. The mold cap can include a tapered portion in which the larger thickness of the tapered portion of the mold cap is proximate to the semiconductor die and the smaller thickness of the tapered portion of the mold cap is away from the semiconductor die. Examples of mold caps with a tapered portion are illustrated in FIGS. 2B and 2C.

In another implementation, an electronic package can include a substrate, a semiconductor die disposed or mounted on a first portion of a surface of the substrate, and a mold cap disposed on a second portion of the surface of the substrate that is different from the first portion. The mold cap can include a tapered portion in which the larger thickness of the tapered portion is proximate to the semiconductor die and the smaller thickness of the tapered portion is away from the semiconductor die. Examples of mold caps with a tapered portion are illustrated in FIGS. 2B and 2C. The thickness of the tapered portion of the mold cap can vary monotonically. Moreover, the thickness of the tapered portion of the mold cap can vary linearly or non-linearly.

The mold cap in the electronic package can have an undercut (e.g., the undercut 210) produced by a flexible die seal and adjacent to the semiconductor die. The tapered portion of the mold cap can have the larger thickness adjacent to the undercut and the smaller thickness away from the undercut towards the end or edge of the substrate.

While the present disclosure has been described with reference to certain implementations, it will be understood by those skilled in the art that various changes may be made and equivalents may be substituted without departing from the scope of the present disclosure. In addition, many modifications may be made to adapt a particular situation or material to the teachings of the present disclosure without departing from its scope. Therefore, it is intended that the present disclosure not be limited to the particular implementations disclosed, but that the present disclosure will include all implementations falling within the scope of the appended claims.

What is claimed is:

1. A method, comprising:
    placing in a mold tool a substrate, the substrate having a surface and a semiconductor die disposed on the surface;
    applying a flexible die seal to a surface of the semiconductor die;
    closing the mold tool to define a space about the semiconductor die and about the surface of the substrate; and
    applying a mold material to at least a portion of the defined space to produce a mold cap having a first surface that is in contact with the surface of the substrate and a second surface that is opposite the first surface,
    wherein:
        the second surface of the mold cap defines a tapered portion of the mold cap in which a larger thickness of the tapered portion of the mold cap is proximate to the semiconductor die and a smaller thickness of the tapered portion of the mold cap is away from the semiconductor die;
        the flexible die seal produces an undercut on the second surface of the mold cap adjacent to the semiconductor die; and
        the tapered portion of the mold cap has the larger thickness adjacent to the undercut and the smaller thickness away from the undercut.

2. The method of claim 1, wherein the thickness of the tapered portion of the mold cap varies monotonically.

3. The method of claim 1, wherein the thickness of the tapered portion of the mold cap varies linearly.

4. The method of claim 1, wherein the thickness of the tapered portion of the mold cap varies non-linearly.

5. The method of claim 1, wherein the mold material includes an epoxy molding compound.

6. The method of claim 1, wherein the substrate includes a coreless substrate.

7. The method of claim 1, comprising producing an electronic package including the substrate, the semiconductor disposed on the surface of the substrate, and the mold cap.

8. The method of claim 1, comprising applying the mold material to at least a portion of the defined space through an opening in the mold tool after the mold tool is closed.

9. A method for producing an electrical circuit, comprising:
    placing in a mold tool a semiconductor die;
    applying a flexible die seal to a surface of the semiconductor die;

closing the mold tool to define a space about the semiconductor die; and applying a mold material to at least a portion of the defined space to produce a mold cap that is in contact with the semiconductor die, wherein:

the mold cap includes a tapered portion in which a larger thickness of the tapered portion of the mold cap is proximate to the semiconductor die and a smaller thickness of the tapered portion of the mold cap is away from the semiconductor die;

the flexible die seal produces an undercut on a second surface of the mold cap adjacent to the semiconductor die; and the tapered portion of the mold cap has the larger thickness adjacent to the undercut and the smaller thickness away from the undercut.

10. The method of claim 9, wherein the thickness of the tapered portion of the mold cap varies monotonically.

11. The method of claim 9, wherein the thickness of the tapered portion of the mold cap varies linearly.

12. The method of claim 9, wherein the thickness of the tapered portion of the mold cap varies non-linearly.

13. The method of claim 9, wherein the mold material includes an epoxy molding compound.

14. The method of claim 9, wherein the semiconductor die is disposed on a substrate.

15. The method of claim 14, wherein the substrate includes a coreless substrate.

16. The method of claim 14, comprising producing an electronic package including the substrate, the semiconductor disposed on the surface of the substrate, and the mold cap.

17. The method of claim 9, comprising applying the mold material to at least a portion of the defined space through an opening in the mold tool after the mold tool is closed.

18. A method comprising:

placing in a mold tool a substrate, the substrate having a surface and a semiconductor die disposed on the surface;

closing the mold tool to define a space about the semiconductor die and about the surface of the substrate;

applying a mold material to at least a portion of the defined space to produce a mold cap having a first surface that is in contact with the surface of the substrate and a second surface that is opposite the first surface; and filling the remaining defined space through an opening in the mold tool, wherein the second surface of the mold cap defines a tapered portion of the mold cap in which a larger thickness of the tapered portion of the mold cap is proximate to the semiconductor die and a smaller thickness of the tapered portion of the mold cap is away from the semiconductor die.

\* \* \* \* \*